United States Patent [19]

Shukuri et al.

[11] Patent Number: 5,357,464
[45] Date of Patent: Oct. 18, 1994

[54] SEMICONDUCTOR MEMORY HAVING WRITING AND READING TRANSISTORS, METHOD OF FABRICATION THEREOF, AND METHOD OF USE THEREOF

[75] Inventors: Shuji Shukuri, Koganei; Toru Koga, Urawa; Shinichiro Kimura, Kunitachi; Digh Hisamoto, Kokubunji; Kazuhiko Sagara, Hachiouji; Tokuo Kure, Tokyo; Eiji Takeda, Koganei, all of Japan

[73] Assignee: Hitachi, Ltd., Tokyo, Japan

[21] Appl. No.: 22,937

[22] Filed: Feb. 26, 1993

[30] Foreign Application Priority Data

Mar. 2, 1992 [JP] Japan .................................. 4-044388

[51] Int. Cl.⁵ .............................................. G11C 11/40
[52] U.S. Cl. .................................... 365/185; 365/189.01
[58] Field of Search .................... 365/185, 182, 189.01, 365/203

Primary Examiner—Terrell W. Fears
Attorney, Agent, or Firm—Antonelli, Terry, Stout & Kraus

[57] ABSTRACT

Disclosed is a semiconductor memory having a self-amplifying cell structure, using (1) a writing transistor and (2) a reading transistor with a floating gate as a charge storage node for each memory cell, and a method of fabricating the memory cell. The writing transistor and reading transistor are of opposite conductivity type to each other; for example, the writing transistor uses a P-channel MOS transistor and the reading transistor (having the floating gate) uses an N-channel MOS transistor. The floating gate of the reading transistor is connected to a single bit line through a source-drain path of the writing transistor, the source-drain path of the reading transistor is connected between the single bit line and a predetermined potential, and the gate electrodes of the writing and reading transistors are connected to a single word line. At least the reading transistor can be formed in a trench, and the word line can be formed overlying the writing transistor and the reading transistor in the trench. Also disclosed is a method of operating the memory cell, wherein the voltage applied to the word line, in a standby condition, is intermediate to the voltage applied to the word line during the writing operation and during the reading operation.

8 Claims, 16 Drawing Sheets

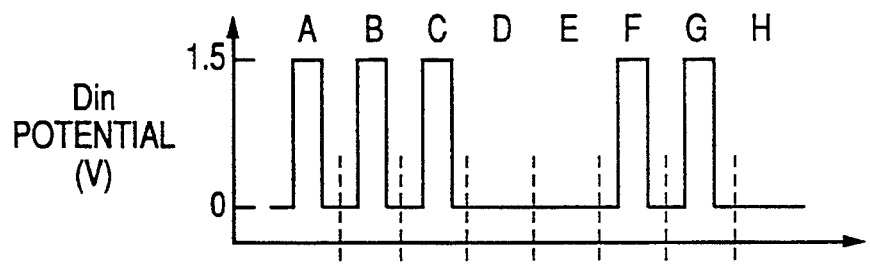
FIG. 22(a) Din POTENTIAL (V)
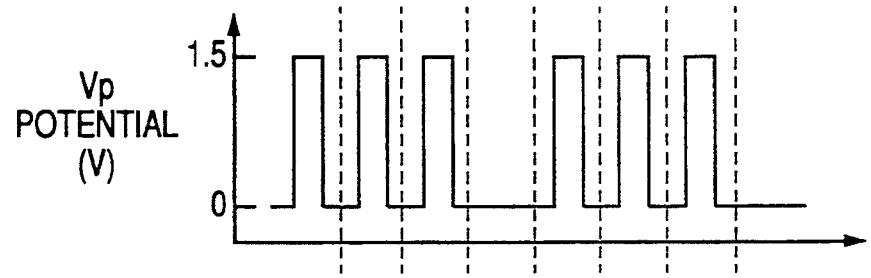
FIG. 22(b) Vp POTENTIAL (V)
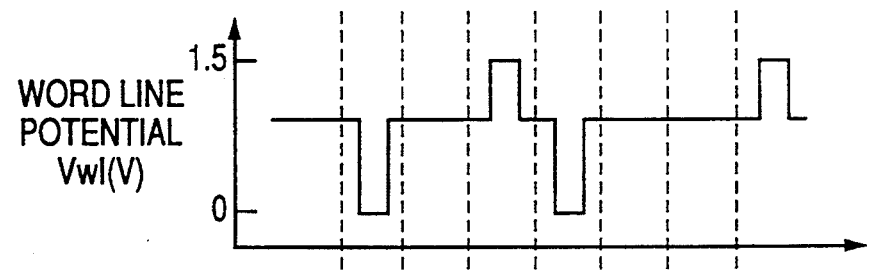
FIG. 22(c) WORD LINE POTENTIAL Vwl(V)
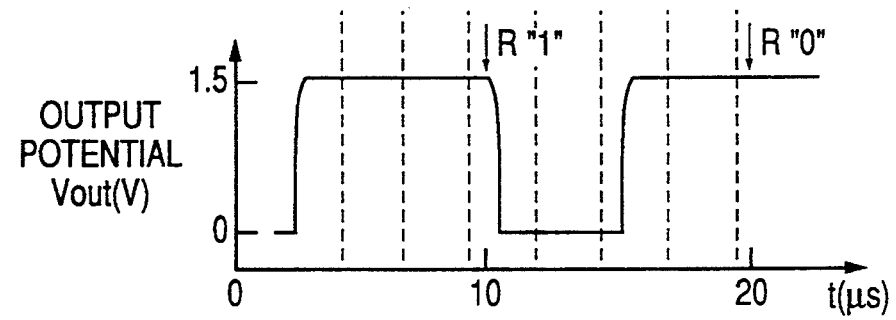
FIG. 22(d) OUTPUT POTENTIAL Vout(V)

SEMICONDUCTOR MEMORY HAVING WRITING AND READING TRANSISTORS, METHOD OF FABRICATION THEREOF, AND METHOD OF USE THEREOF

BACKGROUND OF THE INVENTION

The present invention relates to a semiconductor memory and its fabrication method, particularly to a self-amplifying memory cell which is a large-scale dynamic random access memory (hereafter referred to as a DRAM), allowing ultra-high integration density, and which has two field effect transistors and requires no charge storage capacitor.

DRAMs have been improved in integration degree up to four times in three years, and mass production of 4-megabit DRAMs is being started. This high integration has been achieved by greatly decreasing the element dimensions.

An existing DRAM, as shown by an equivalent circuit diagram in FIG. 6, comprises at least a storage capacitor 101 for storing charges, a bit line (DL) for feeding charges to the capacitor, a switching transistor (SM) for controlling the flow of charges, and a word line (WL) connected to the gate of the switching transistor.

In the structure of the existing DRAM memory cell (because the cell is a one-transistor-one-capacitor cell, it is hereafter referred to as a 1T-1C cell), it is a large problem to maintain reliability because troubles such as decrease of signal-to-noise ratio (hereafter referred to as SN ratio) and data inversion due to incoming alpha rays occur since the number of stored charges is decreased due to a great reduction of the cell area and decrease of the supply voltage.

Therefore, a so-called stacked type cell, made by forming part of a storage capacitor on a switching transistor or on an element-isolation oxide film, and a trenched cell made by forming a deep trench in a substrate and a charge storage capacitor on the side wall of the trench, are main cell structures used, after 4-megabit DRAMs, as a memory cell capable of increasing the number of stored charges even if the cell area is greatly decreased.

Trial fabrication of 16- and 64-megabit DRAM cells has been attempted by making full use of the above three-dimensional cell and a self-alignment process. However, if the memory cell area is decreased according to the existing trend, the cell area comes to approximately 0.5 $\mu m^2$ in 256-megabit DRAMs. To realize a large-enough storage capacitor in the very small cell area, it is necessary to use a very thin capacitor insulating film for the stacked type cell, or to form a deep trench with a depth of 5 $\mu m$, an opening width of approximately 0.3 $\mu m$, and an aspect ratio of 15 or more for the trenched cell. However, it is very difficult to solve these problems with existing semiconductor processing techniques.

Instead, various so-called self-amplifying memory cell structures have been proposed which do not require a relatively-large charge storage capacitor, by substituting for the charge storage capacitor an active transistor.

FIG. 7 is an equivalent circuit diagram of a self-amplifying memory cell comprising two n-channel field effect transistors (WM and RM), two bit lines (WD and RD), and two word lines (WW and RW), proposed in *Extended Abstract of 16th Conference on Solid State Device and Materials,* Kobe, 1984, pp. 265-268. The self-amplifying memory cell in FIG. 7 has a reading transistor (RM) having a floating gate which acts as a charge storage node, instead of the existing charge storage capacitor. To write data in the cell, a certain potential is applied to the writing word line (WW) and reading word line (RW) before applying "ground potential" or "positive potential" to the writing bit line (WD), in accordance with "0" or "1" of stored data, to control the number of positive charges of the charge storage node. The threshold voltage (Vth) of the reading transistor (RM) is decreased in accordance with the number of positive charges of the charge storage node and turned on. After data is written, the wiring word line (WW) is fixed to the ground potential.

To read stored data, a certain potential is applied to the reading word line (RW) to detect the potential fluctuation of the reading bit line (RD) caused by the "on" or "off" state of the reading transistor (RM). In this case, the drain electrode potential Vss of the reading transistor (RM) is fixed to the supply voltage. This cell can be operated even if the node capacitance ratio between the storage node and the reading-transistor channel is relatively small. However, the cell area cannot greatly be decreased because the cell requires lines twice as many as those of the existing memory cell (that is, 2 word lines and 2 data lines).

Unlike the above cell, Japanese Patent Laid-Open No. 5269/1985 discloses a cell comprising one bit line (DL) and two word lines (WW and RW), as shown by an equivalent circuit in FIG. 8(a).

To write data in this cell, the reading word line (RW) is grounded and a certain voltage is applied to the writing word line (WW). Under the above state, the potential of the bit line (DL) is transmitted to the floating gate of the reading transistor (RM), serving as the charge storage node, through the writing transistor (WM), to store positive or negative charges in or to draw them from the floating gate and write the data of "0" or "1" by grounding or raising the potential of the bit line (DL).

To read data from this cell, the writing word line (WW) is grounded and a certain potential is applied to the reading word line (RW). In this case, the reading transistor (RM) is turned off unless charges are stored in the charge storage node, and turned on if charges are stored in it. Therefore, the potential of the bit line (DL) changes according to "0" or "1" of stored data, and data can be read. In this case, the potential Vss of the drain electrode of the reading transistor (RM) is fixed to the ground potential or supply voltage. Also in this cell, it is difficult to greatly decrease the cell area because two word lines are arranged.

This Japanese Patent Laid-Open No. 25269/1985 discloses a cell comprising one bit line (DL) and one word line (WL), in a memory cell having a writing transistor (WM), and a reading transistor (RM) having a floating gate. See FIG. 8(b). In this embodiment shown herein in FIG. 8(b), both the writing transistor and the reading transistor are of the same conductivity type. Moreover, during operation of the memory cell the standby potential (Vw(S)) applied to the word line is less than the potential applied to the word line both during writing (Vw(W)) and during reading (Vw(R)). See FIG. 8(c).

The structure, and operation thereof, shown in FIG. 8(b) and 8(c) herein, have the following deficiencies. The potential applied to the word line during reading is dependent not only on the threshold voltage of the reading transistor (Vth(RM)), but is also dependent on the change in threshold voltage (Vth) shown in FIG. 8(c). Moreover, the threshold voltage of the writing transistor should be within the range of this change in threshold voltage shown in FIG. 8(c). In addition, this change in threshold voltage is relatively large—greater than 0.8–1.0 V.

Because all of the existing self-amplifying memory cells detect potential with the source-drain current of the reading transistor, they essentially perform nondestructive reading unlike the existing 1T-1C cells. Therefore, it is possible to basically decrease the number of stored charges. However, since stored charges are extinguished by the leak current of the writing transistor, refreshing is necessary similarly to the existing cell.

In the existing 1T-1C cell, word and data lines are arranged at minimum dimensions. Therefore, the cell area of the normal folded bit-line cell arrangement equals the value (word line pitch×2)×(data line pitch). However, the above-mentioned existing self-amplifying memory cell requires a number of metal layers 1.5 to 2 times as much as the 1T-1C cell constitution. Therefore, the memory cell has a critical problem for high integration of DRAMs that the cell area increases three to four times.

Another problem is that it is difficult to secure a stable operation of the self-amplifying memory cell, in particular, sufficient data holding time. For example, to stably operate a 256-megabit DRAM, it is necessary to decrease the leak current per cell to $10^{-15}$ A or less. For the cells in FIGS. 7 and 8(a), however, it is inevitable to form either of the writing transistor (WM) and reading transistor (RM) in a polycrystalline silicon thin film. Therefore, because leak current passing through the grain boundary of the polycrystalline silicon thin film increases, it is very difficult to decrease the leak current per cell to $10^{-12}$ A or less. This is a critical defect for a DRAM.

Moreover, because the source-drain region of either of the writing transistor (WM) and reading transistor (WM) are formed in a polycrystalline silicon thin film having a large impurity diffusion coefficient compared with a single crystal, it is difficult to increase and control the channel length.

As described above, it is difficult to stably operate the existing self-amplifying memory cell and decrease the cell area because of various factors and it is not effective to decrease the cell area by substituting a capacitor with a transistor.

SUMMARY OF THE INVENTION

Therefore, an object of the present invention is to provide a semiconductor memory applicable to a megabit-class very-high-integrated DRAM, to be easily decreased in size, and realizing stable cell operation, and its fabrication method.

It is a further object of the present invention to provide a self-amplifying memory cell, of a DRAM utilizing a reading transistor and a writing transistor, the reading transistor having a floating gate for charge storage, wherein integration density is increased, and a highly reliable memory cell is provided; it is a still further object of the present invention to provide a method of fabricating such memory cell.

It is a further object of the present invention to provide a method of using a memory cell so as to realize stable cell operation in a cell having both a writing transistor and a reading transistor, the reading transistor having a floating gate for charge storage.

Other objects and features of the present invention will become more apparent by referring to the following description, and drawings attached hereto. The description and drawings are illustrative of the present invention and are not limiting thereof, the present invention being defined by the appended claims.

The above objects are achieved according to the present invention, using a reading transistor and a writing transistor, the reading transistor having a floating gate for charge storage, and a single word line and a single data line, wherein channel regions of the reading transistor and of the writing transistor are of opposite conductivity type to one another. The gate electrodes of both the writing transistor and the reading transistor are electrically connected to the word line, the source and drain regions of the reading transistor are electrically connected between a predetermined voltage (e.g., Vss) and the data line, and the floating gate of the reading transistor is electrically connected to the data line via the source and drain regions of the writing transistor.

Moreover, the foregoing objects are further achieved by providing at least a source region of the reading transistor of the memory cell in a semiconductor substrate, and further by forming at least the reading transistor in a trench formed in a semiconductor substrate.

In addition, the foregoing objects are achieved by a method of fabricating the memory cell, wherein the word line is formed overlying both the writing transistor and the reading transistor. This word line can be made of the same level of conductive layer (e.g., polycrystalline silicon, polycide, etc.) used for gate electrodes of peripheral circuitry of the DRAM.

The foregoing objects are also achieved by a process of using the memory cell, wherein a standby voltage applied to the word line is intermediate a potential applied to the word line during the writing operation (writing voltage) and a potential applied to the word line during the reading operation (reading voltage). It is within the present invention that either the writing voltage or the reading voltage can be higher than the standby voltage, with the other of the writing voltage and reading voltage then being lower than the standby voltage. For example, when the word line WL is at a low potential, the writing transistor is turned on, data from the bit line DL is stored in the floating gate of the reading transistor, and the threshold voltage of the reading transistor is set. When the word line is at a high potential, the reading transistor is turned on or off in accordance with the threshold value, to allow data to be read.

Preferably, the standby voltage applied to the word line is ground voltage (GND); one of the potential applied to the word line during the reading operation or during the writing operation is the supply voltage (Vcc), and the other of the potential applied to the word line during the reading operation or during the writing operation is minus supply voltage (−Vcc). This limits current and voltage during standby to a minimum value.

Accordingly, by the present invention a memory cell is achieved which has increased reliability and stability, and which occupies decreased space on the semiconductor substrate (so as to provide a DRAM with increased integration). Moreover, by the present invention the memory cell can be fabricated by a relatively simplified process. In addition, the memory cell can be operated with a decreased potential difference between the standby potential applied to the word line and the writing potential.

BRIEF DESCRIPTION OF THE DRAWINGS

FIG. 22 is a waveform diagram illustrating memory operation of the fifth embodiment of the present invention;

DETAILED DESCRIPTION OF THE INVENTION

Figure 1:
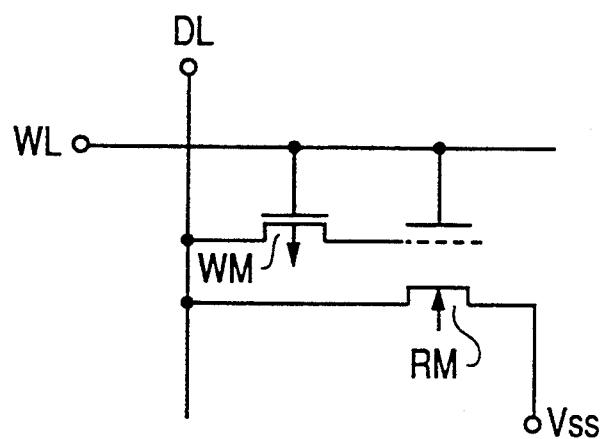
FIG. 1 is an equivalent circuit diagram of a memory cell according to a first embodiment of the present invention.

While the present invention will be described in connection with specific and preferred embodiments, it will be understood that it is not intended to limit the invention to those embodiments. To the contrary, it is intended to cover all alterations, modifications and equivalents as may be included within the spirit and scope of the invention as defined by the appended claims.

While the present invention is described in terms of apparatus, and materials, comprised of specific components, it is intended that the apparatus, and materials, can consist essentially of, or consist of, the specific components.

The following disclosure is provided in connection with the various drawing figures. In the various drawing figures, structure having substantially the same function is denoted by the same reference characters.

FIG. 1 shows an equivalent circuit diagram of a memory cell illustrating a technical idea of the present invention. A feature of the cell structure lies in the fact that the cell uses transistors of different channel conduction types, that is, complementary metal oxide semiconductor transistors, by using, for example, a P-channel insulating-gate field effect transistor as the writing transistor (WM) and an N-channel insulating-gate field effect transistor as the reading transistor (RM).

Moreover, the floating gate which is the charge storage node of the reading transistor (RM) is connected to the bit line (DL) through the source-drain path of the writing transistor (WM), the source-drain path of the reading transistor (RM) is connected between the bit line (DL) and a predetermined potential point (Vss), and the gate of the reading transistor (RM) and that of the writing transistor (WM) are connected to the word line (WL).

Advantages of the cell structure of the present invention are described later in detail.

Figure 4A:
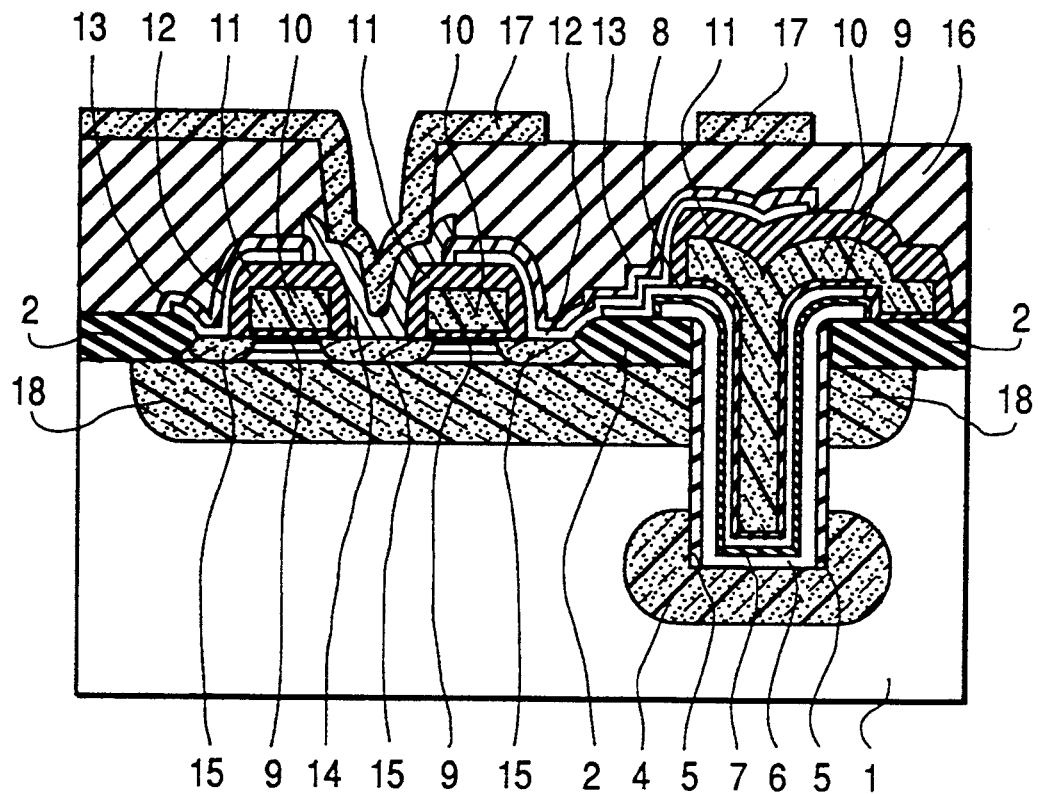
FIG. 4(a) is a sectional view of the memory cell according to the first embodiment of the present invention, along line A-B of either of FIG. 2 or FIG. 3.
Figure 4B:
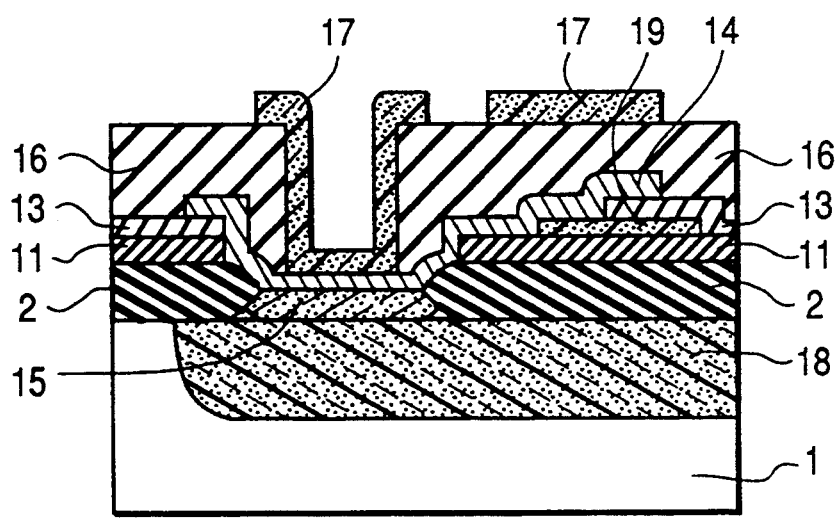
FIG. 4(b) is a sectional view of the memory cell according to the first embodiment of the present invention, along lines X-Y of either of FIG. 2 or FIG. 3.

FIGS. 4(a) and 4(b) show sectional views of a device structure for realizing the equivalent circuit of the memory cell of the present invention shown in FIG. 1.

A feature of the cell structure shown in FIG. 4(a) is that in a semiconductor substrate 1 of a first conductivity type (P-type), a well region 18 of a second conductivity type (N-type) is formed. A writing transistor (WM) of the first conductivity type (P-channel type) which uses a word line 10 (WL) as a gate electrode, and has a pair of drain-source regions 15 of the first conductivity type (P-type), is formed in the well region 18, one of the source-drain regions 15 being connected to a bit line 17 (DL) through a first interconnection pad 14. A reading transistor of the second conductivity type (N-channel type) has a charge storage node 8 as a floating gate connected to the other of the source-drain regions 15 of the writing transistor (WM). This reading transistor has a channel region 6 isolated from the well region 18 by an insulating film 5, and has a capacitor insulating film 7, a gate insulation film 9, and a source region 4 of the second conductivity type (N-type) embedded in the semiconductor substrate 1. This reading transistor is formed in a trench made in the semiconductor substrate, the word line 10 (WL) being used as a gate electrode thereof. Moreover, the cell is provided with an element isolation region 2 and insulating films 11, 13 and 16 for insulation and isolation. As shown in FIG. 4(b), the reading transistor drain 19 is electrically connected to the data line 17 and drain 15 of the writing transistor, via the first interconnection pad 14. According to the present invention, the word line 10 is formed overlying both the writing transistor (e.g., as a gate electrode thereof), and the reading transistor formed in a trench. Moreover, by use of the trench structure, surface area occupied by the reading transistor is reduced. In addition, as is clear from FIG. 4(b), the reading transistor uses a polycrystalline silicon thin film for the drain region.

Figure 2:
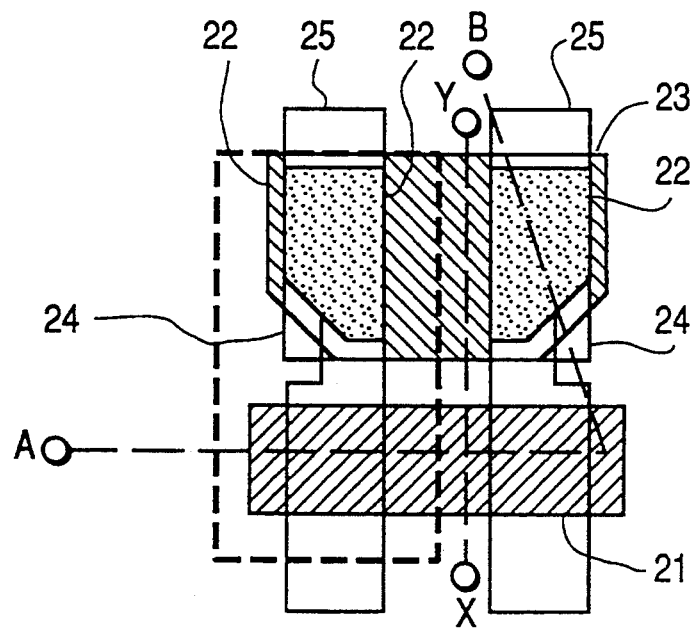
FIG. 2 is a plane layout drawing of the memory cell according to the first embodiment of the present invention.
Figure 3:
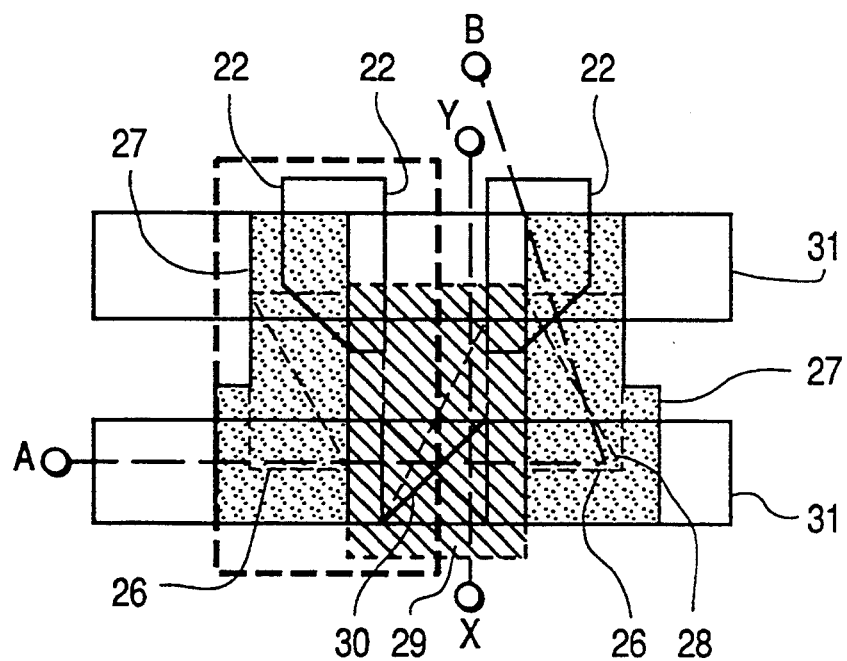
FIG. 3 is a plane layout drawing of the memory cell according to the first embodiment of the present invention.

FIGS. 2 and 3 show plane layout drawings of the memory cell having the element structure of the present invention in FIGS. 4 (a) and 4 (b).

As shown in FIG. 2, a word line pattern 25 and a pattern 23 for forming a channel region 6 of the reading transistor are arranged by being covered with a pattern 21 for specifying a region where the writing transistor is formed and a pattern 22 for specifying a region where the reading transistor is formed. FIG. 2 also shows a pattern 24 for forming the charge storage node 8.

Moreover, as shown in FIG. 3 and especially in FIG. 4(b), the following are arranged: a pattern 31 for forming a bit line, a pattern 26 for making a hole to connect the source region 15 of the writing transistor with the charge storage node 8 of the reading transistor, a pattern 27 for forming a second interconnection pad 12, a pattern 28 for forming an opening to connect the drain region 15 of the writing transistor with the drain region 19 of the reading transistor, a first interconnection pad 29, and a pattern 30 for forming an opening to connect the second interconnection pad 12 with the bit line 17.

Functioning of the present invention will be described below, by describing an operation of the memory cell of the present invention shown in FIG. 1. In connection with this operation, see FIG. 5. In the description below, the writing transistor (WM) is assumed as a p-channel transistor (hereafter referred to as a pMOS) and the reading transistor (RM) is assumed as an n-channel transistor (hereafter referred to as an nMOS). However, even if each transistor has an opposite conductivity-type channel, there is no problem in the basic operation.

First, the threshold voltage (hereafter referred to as Vth) of each transistor shown in FIG. 1 is set to a standard value (e.g., $-0.3$ V) for the pMOS and to a value higher than the supply voltage (for example, Vth=1.8 V by assuming the supply voltage as 1.5 V) for the nMOS. Then, the potential (Vss) of the source region 4 of the reading transistor (RM) is fixed to the ground potential, the potential of the well 18 of the pMOS is fixed to the supply voltage (Vcc), and the potential of the nMOS substrate 1 is fixed to the ground potential.

By setting the potential of the word line 10 (WL) in a standby state (Vw(S)) to approximately ½ the supply voltage (Vcc), every transistor is kept off even if the bit-line (DL) potential equals the supply voltage.

Figure 5:
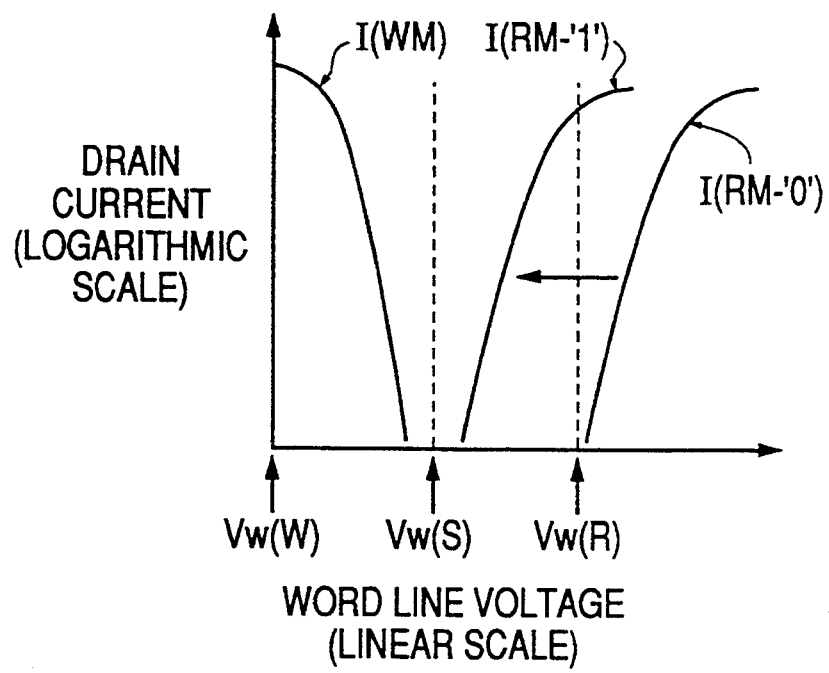
FIG. 5 is a characteristic diagram illustrating memory cell operation according to the first embodiment of the present invention.

When the data "1" is written in this cell, a desired bit line (DL) is selected to pre-charge the potential up to the supply voltage (Vcc) before the potential of the word line (WL) is decreased to the ground potential (Vw(W)), as shown in FIG. 5, to feed positive charges to the charge storage node from the bit line (DL) by the on-current (I(WM)) of the pMOS (WM). The Vth of the nMOS RM is decreased by the positive charges and the data "1" is written.

To read the data "1" the bit line (DL) is selected to pre-charge the potential up to the supply voltage before raising the word line potential up to the supply voltage (Vw(R)), as shown in FIG. 5. In this case, because the nMOS (RM) is turned on (I(RM-"1")) if the data "1" is written, the bit line (DL) potential lowers. Unless any charge is stored in the charge storage node, the nMOS (RM) is kept off and the potential of the bit line (DL) does not change even if the potential of the word line (WL) is raised to the supply voltage or higher because the Vth of the nMOS is higher than the supply voltage (I(RM-"0")). It is judged whether the data is "1" or "0" on the basis of the potential change of the bit line (DL) due to a presence or absence of positive charges in the charge storage node.

The data "0" is written in this cell by keeping the bit line (DL) potential at the ground potential, lowering the word line (WL) potential to the ground potential, turning on the pMOS (WM) to draw the positive charges from the charge storage node toward the bit line (DL), and returning the Vth of the reading transistor (RM) to the original high value.

Figure 6:
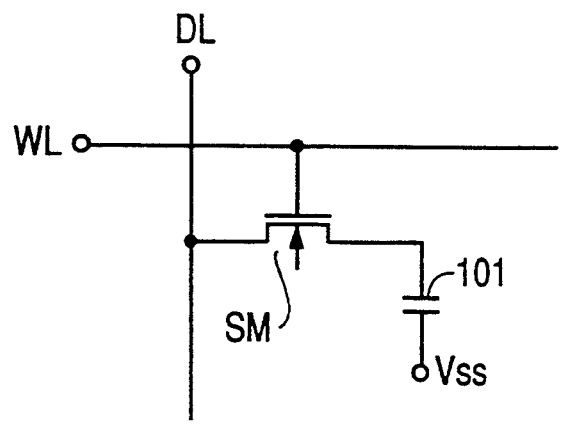
FIG. 6 is an equivalent circuit diagram of a conventional memory cell.
Figure 7:
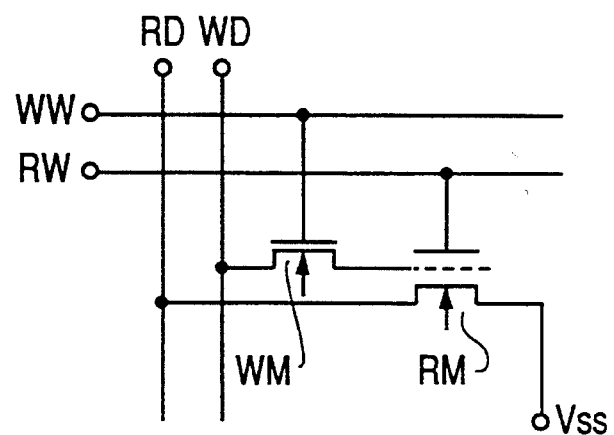
FIG. 7 is an equivalent circuit diagram of a conventional memory cell.
Figure 8A:
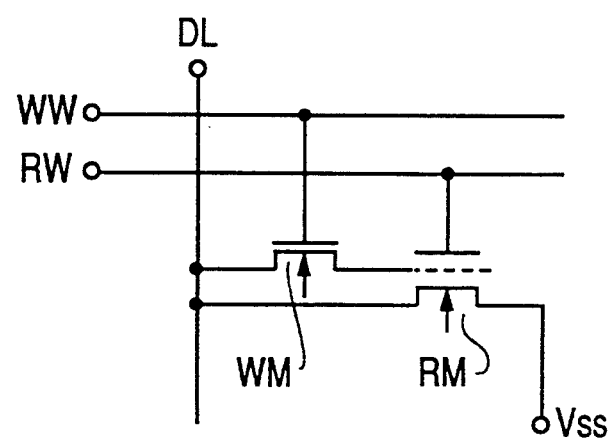
FIG. 8(a) is an equivalent circuit diagram of a conventional memory cell.
Figure 8B:
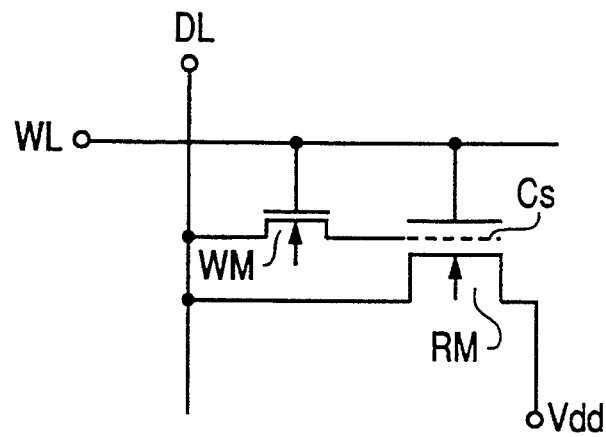
FIG. 8(b) is an equivalent circuit diagram of a conventional memory cell.
Figure 8C:
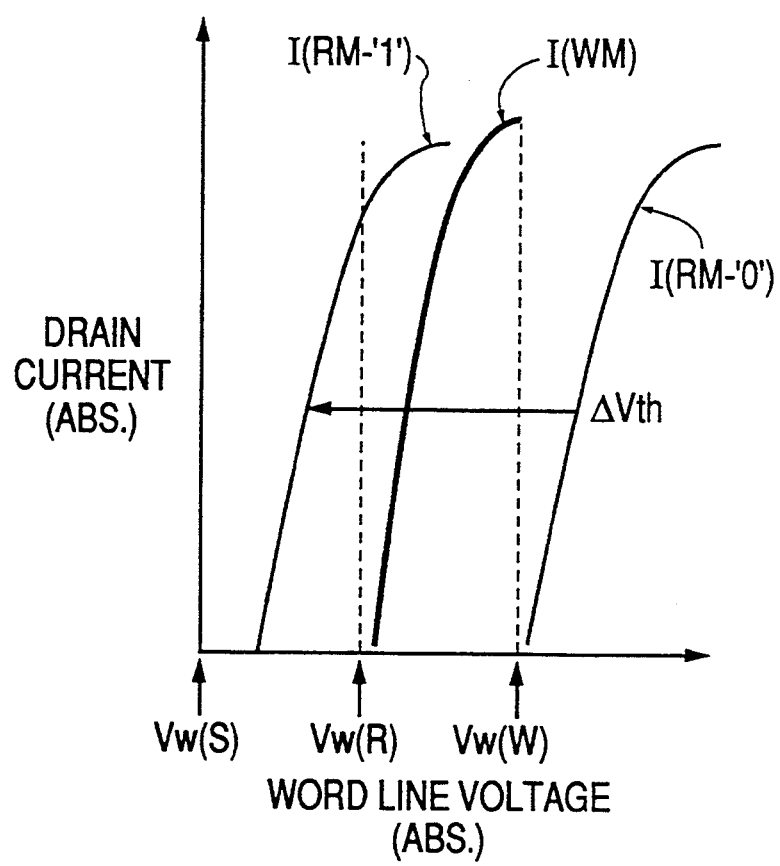
FIG. 8(c) is a characteristic diagram illustrating memory cell operation of the conventional memory cell shown in FIG. 8(b)

Differences between the cell of the present invention shown in FIGS. 1–3, 4(a) and 4(b), and the conventional self-amplifying cell shown in FIGS. 7, 8(a) and 8(b), lie in the fact that the cell of the present invention can be constituted with one word line (WL) similarly to the existing 1T-1C cell in FIG. 6 because the writing transistor (WM) and reading transistor (RM) are constituted with complementary MOS (CMOS) structure as shown in FIG. 1; and because data can be written or read without malfunction even if only one word line is used since a difference of approximately the supply voltage is given to the threshold voltage of the writing transistor (WM, e.g., pMOS) and that of the reading transistor (RM, e.g., nMOS), and the word line potential (Vw(W)) for data write is set to a value higher than the word line potential (Vw(S)) in a standby state and word line potential for data read is set to a value lower than the word line potential (Vw(S)) in the standby state. Thus, by decreasing the number of word lines to 1, cell area the same as that of the conventional 1T-1C cell can be achieved, and the problem that the cell area of the conventional self-amplifying cell increases, can be solved.

Another feature of the present invention, as shown in FIG. 4(a), lies in the fact that the writing transistor (WM) is formed on a semiconductor substrate, and the reading transistor (RM) uses a polycrystalline silicon thin-film transistor formed on the inner wall of the trench formed in the semiconductor substrate.

As previously described, it is very difficult to decrease the leak current of polycrystalline silicon thin-film transistors to $10^{-12}$ A or less by current semiconductor techniques. For the cell of the present invention, however, stable cell operation and data holding characteristics can be secured regardless of the leak current. This is because the transistor leak current does not influence the disappearance of positive charges for data writing since the cell of the present invention uses a polycrystalline silicon thin-film transistor only for the reading transistor, and the leak current between the source and drain of the polycrystalline silicon thin-film transistor is not directly related to a charge storage node, as shown in FIG. 1.

Moreover, because the source region of the reading transistor is set to ground potential, the transistor leak current has an influence only when the bit line (DL) is precharged. That is, the leak current of the reading transistor serves as a factor to control the power consumption in a standby state but it does not influence the basic operation of the cell.

Furthermore, because the reading transistor is vertically disposed in the cell of the present invention, it is unnecessary to decrease the transistor channel length to decrease the cell area. This is one of the features of the present invention for avoiding a weak point of conventional polycrystalline silicon thin-film transistors in which it is difficult to decrease the channel length.

As described above, the cell structure of the present invention makes it possible to solve the problem of the conventional self-amplifying memory cell and easily to realize 256-megabit or higher integrated DRAMs. Therefore, the present invention has a remarkable industrial advantage.

Embodiments of the present invention will be described below in detail by referring to the drawings. These embodiments are illustrative of, and not limiting of, the present invention, whose intended scope is defined by the appended claims.

Embodiment 1

The first embodiment of the present invention is described below by referring to FIGS. 9 to 12.

Figure 9:
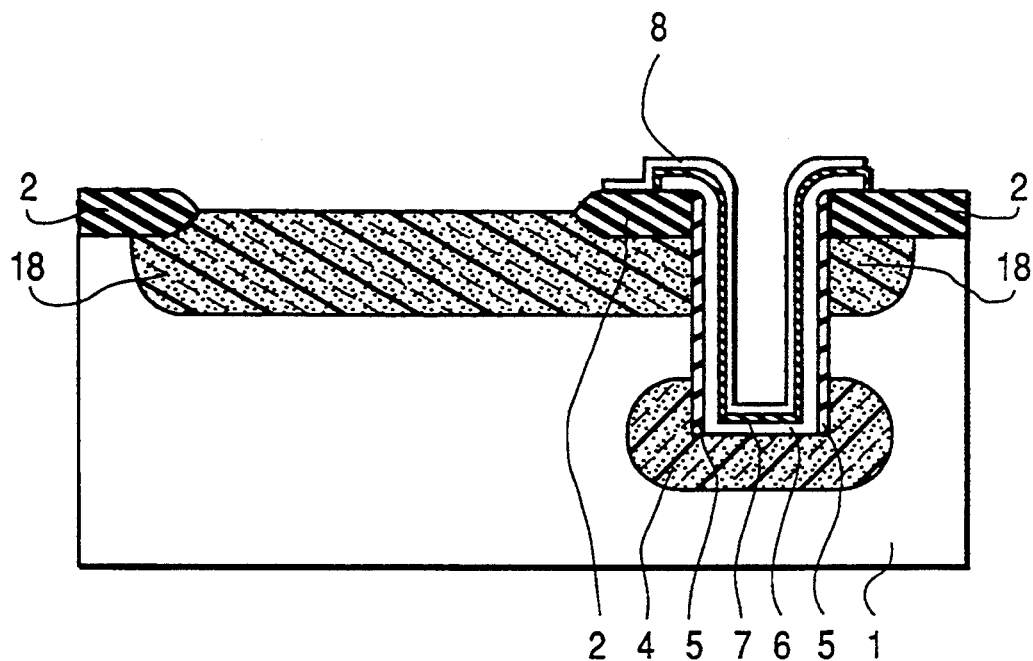
FIG. 9 is a sectional view for illustrating a method for fabricating the memory cell of the first embodiment of the present invention.

First, as shown in FIG. 9, an n-type well region 18 with a junction depth of 1 $\mu$m and a phosphorus (P) concentration of $5 \times 10^{17}$/cm$^3$ at its surface, is formed only on a region of a single crystalline silicon substrate where a memory cell is to be formed, the silicon substrate being a p-type silicon substrate 1 with a resistivity of 10 $\Omega$cm.

Regions of the silicon substrate, other than the region where the writing transistor is to be formed, are thermally oxidized to form an element isolation region 2 comprising, e.g., a 350 nm-thick silicon oxide film.

Moreover, a trench with a depth of 2 $\mu$m is formed in the region where the reading transistor is to be formed, through the element isolation region 2, and a silicon oxide film is deposited in the trench through a chemical vapor deposition method (hereafter referred to as a CVD method); such silicon oxide film formed by a CVD method is then etched, through anisotropic dry etching, to form insulating film 5 comprising a 80 nm-thick silicon oxide film. See FIG. 9.

A reading-transistor source region 4 with an average phosphorus (P) concentration of $1 \times 10^{20}$/cm$^3$ is formed at the bottom of the trench.

Then, a channel domain 6 of the reading transistor comprising a 20 nm-thick polycrystalline silicon film, deposited through the CVD method, is formed on the inner wall of the insulating film 5 in the trench. While the channel domain 6 is deposited through the CVD method, boron (B) with an average concentration of $3 \times 10^{18}$/cm$^3$ is introduced into the polycrystalline silicon film 6 so that the threshold voltage (Vth) of the reading transistor comes to 1.7 V.

A 20 nm-thick polycrystalline silicon film is also provided at a location where drain region 19 of the reading transistor is to be formed. Then, a resist is coated with a thickness of 1 $\mu$m, and is planarized by dry etching, as known in the art, so as to fill in the trench. Arsenic (As) ions are implanted to the topmost surface of the 20 nm-thick polycrystalline silicon film where the drain region of the reading transistor is formed, at a dose of $2 \times 10^{14}$/cm$^2$ and an acceleration energy of 20 keV, in order to form the drain region 19.

Moreover, an insulating film 7 comprising a 5 nm-thick silicon oxide film, deposited by the CVD method, is formed so as to cover the channel domain 6, and then a 50 nm-thick charge storage node 8 (e.g., a floating gate of the reading transistor), deposited through the CVD method, is formed on the insulating film 7, as shown in FIG. 9.

Figure 10:
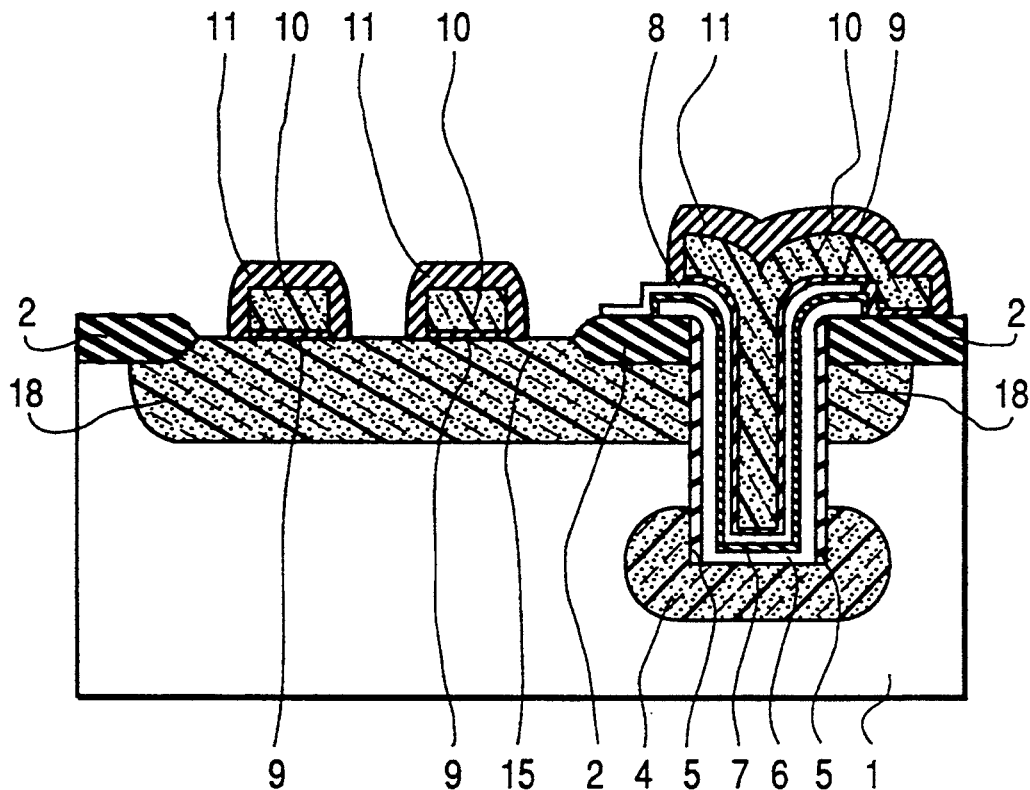
FIG. 10 is another sectional view for illustrating this method for fabricating the memory cell of the first embodiment of the present invention.

Then, as shown in FIG. 10, boron (B) ions are implanted to the surface of the n-type well region 18 where a writing transistor is formed at a dose of $3 \times 10^{12}$/cm$^2$ and an acceleration energy of 50 keV, so that the threshold voltage of the writing transistor comes to $-0.3$ V.

Then, a 5 nm-thick gate insulating film 9 is formed through the CVD method, a word line 10 comprising a 150 nm-thick polycrystalline silicon film with a resistivity of 50 cm is formed on the gate insulating film 9 through the CVD method, and an insulating film 11 comprising a 100 nm-thick silicon oxide film is formed around the word line 10.

Figure 11:
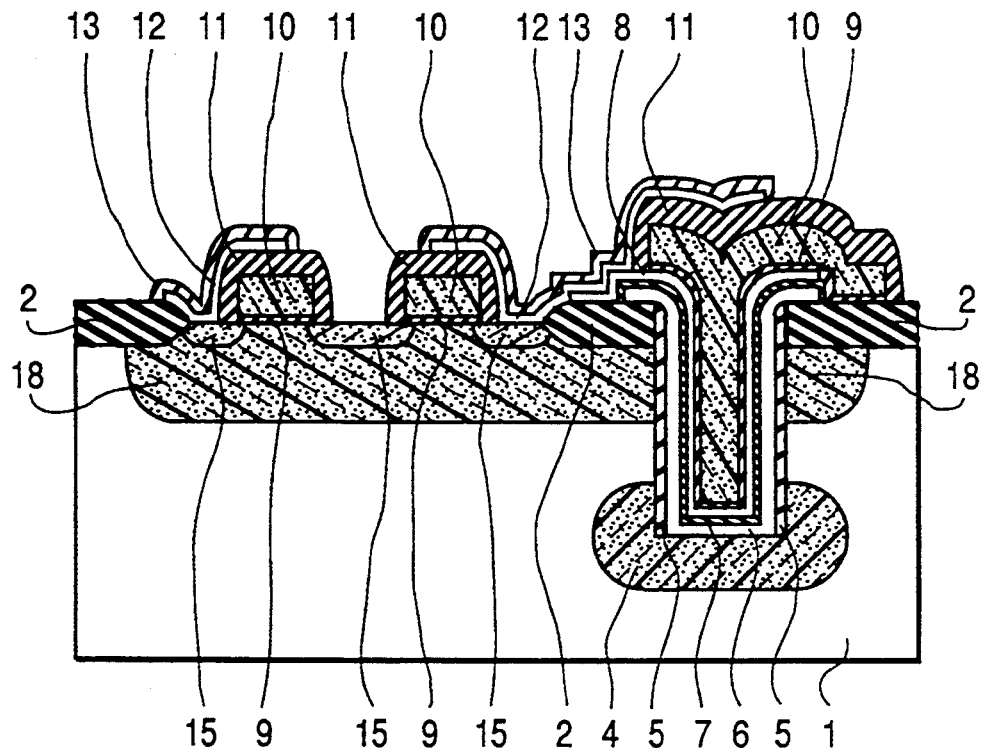
FIG. 11 is another sectional view for illustrating this method for fabricating the memory cell of the first embodiment of the present invention.
Figure 12:
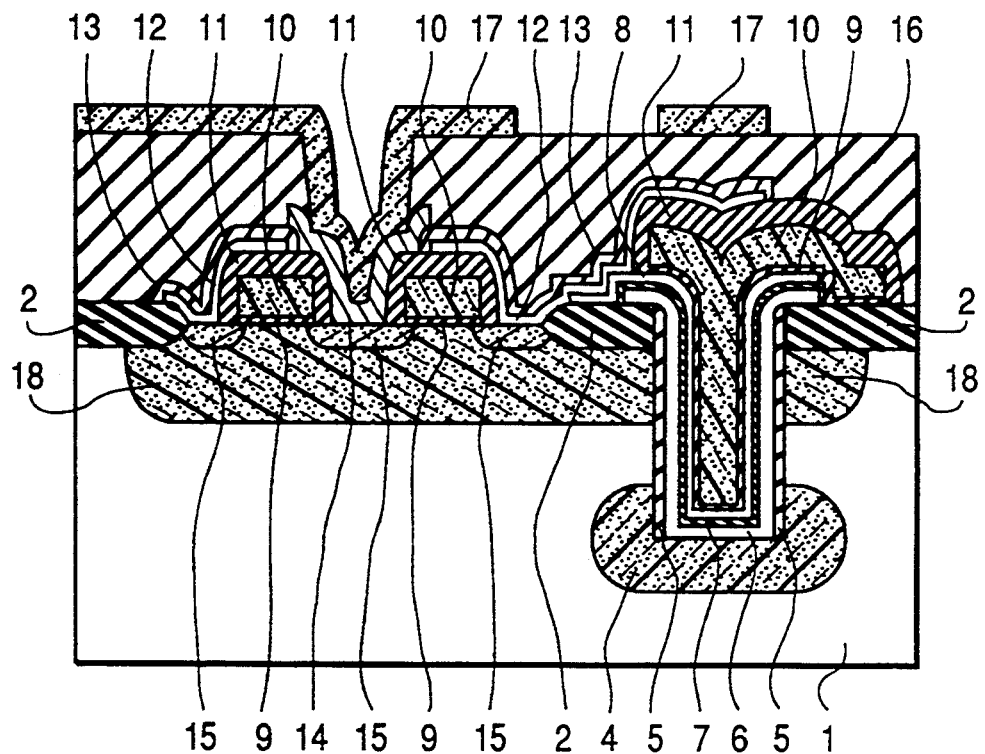
FIG. 12 is another sectional view for illustrating this method for fabricating the memory cell of the first embodiment of the present invention.

Moreover, as shown in FIG. 11, a second interconnection pad 12, comprising a 100 nm-thick polycrystalline silicon film containing phosphorus (P) with an average concentration of $3 \times 10^{21}$/cm$^3$, is formed through the CVD method in order to connect the charge storage node 8 with the source region 15 of the writing transistor; and an insulating film 13 comprising a 100 nm-thick silicon oxide film is deposited through the CVD method around the second interconnection pad 12. Furthermore, as shown in FIG. 12, a first interconnection pad 14 comprising 100 nm-thick titanium nitride (TIN) is formed through the CVD method on one of the source-drain regions of the writing transistor, so as to be connected to a bit line, and an insulating film 16 serving as an element protective film is formed on the first interconnection pad through the CVD method. While the CVD steps are being performed, the source-drain region 15 of the writing transistor is automatically formed due to thermal diffusion of phosphorus (P) from the second interconnection pad 12 and the first interconnection pad 14.

Then, a bit line connection hole is formed on the insulating film 16 on the first interconnection pad 14; and, moreover, a bit line 17 is formed to complete the memory cell of the embodiment shown in FIGS. 2, 3, 4(a) and 4(b). The first interconnection pad 14 is connected to one of the source-drain regions of the writing transistor and is also connected to the drain region of the reading transistor.

It was confirmed that the memory cell of this embodiment normally operated under operational conditions that the supply voltage was 1.5 V, the word line potential for data write was 0 V, the word line potential for data read was 1.5 V, and the word line potential under a standby state was 1.0 V. Moreover, a word line pitch of 0.6 $\mu$m, bit line pitch of 0.5 $\mu$m, and cell area of 0.6 $\mu$m$^2$ were realized. This makes it possible to fabricate a 256-megabit DRAM through a 0.25-$\mu$m fabrication technique.

Embodiment 2

Figure 13:
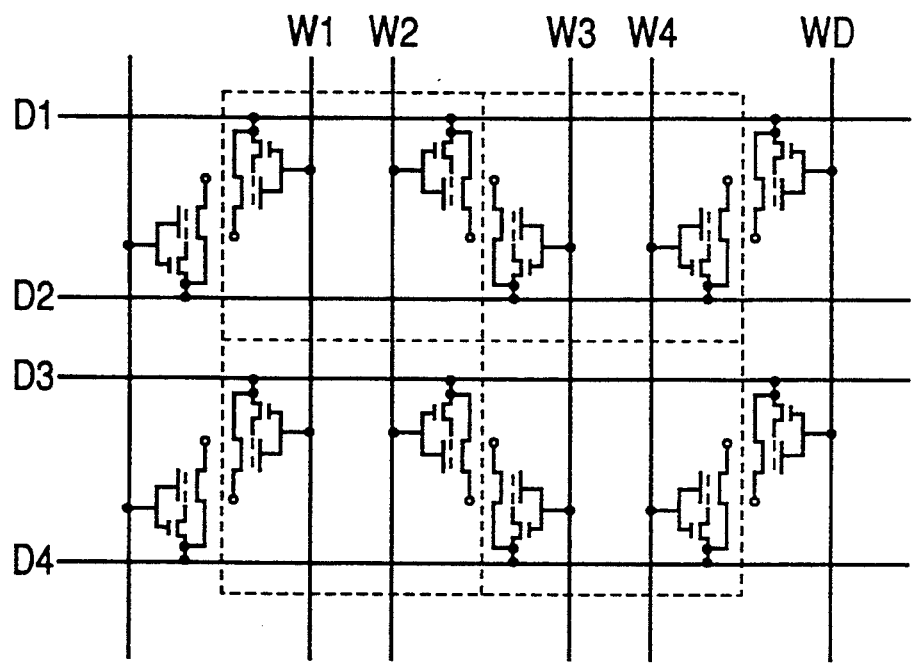
FIG. 13 is a circuit diagram of a memory of the second embodiment of the present invention.
Figure 14:
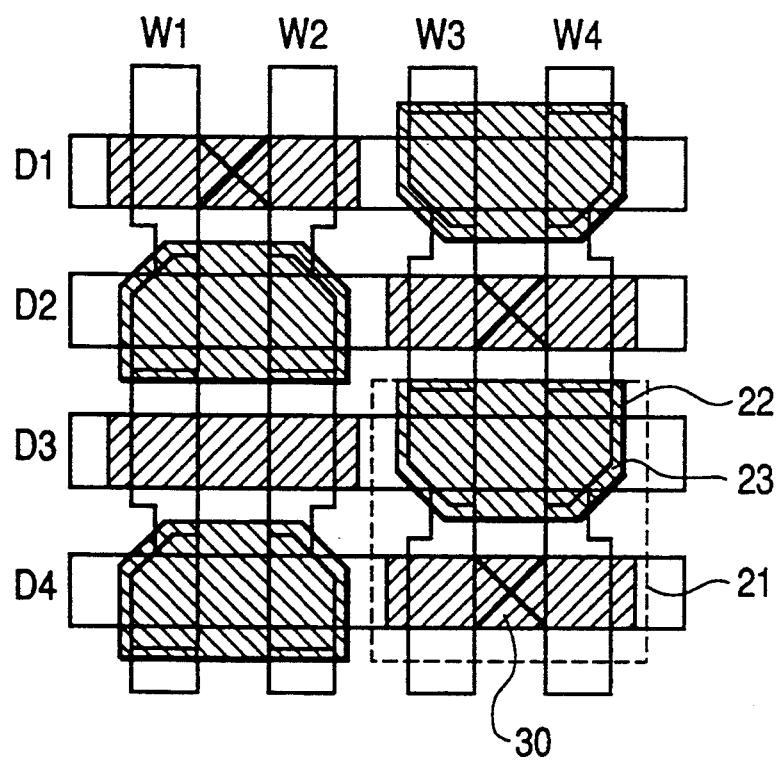
FIG. 14 is a plane layout drawing of this memory of the second embodiment of the present invention.

A second embodiment of the present invention will be described below by referring to FIG. 13, showing a memory cell circuit, and FIG. 14, showing a plan layout of the memory cell.

In this embodiment, a memory array will be described in which memory cells are arranged in accordance with a folded bit line system described in Embodiment 1.

The circuit diagram of the memory cell of this embodiment shown in FIG. 13 describes part of a memory array, in which four word lines (W1, W2, W3 and W4) and four bit lines (D1, D2, D3 and D4) are arranged and these lines are connected with sixteen 2-bit cells (shown by a broken line in FIG. 13), respectively. For example, in FIG. 13 D1 is a bit line and D2 a dummy bit line. WD in FIG. 13 is a dummy word line. The bit lines D1 and D2 are connected to one differential amplifier, and the bit lines D3 and D4 are connected to the other differential amplifier. Each bit line connects with a dummy cell for performing differential sensing of the bit line potential.

To realize the memory cell array of this embodiment, the layout shown in FIG. 14 was used. Four bit line patterns (D1, D2, D3 and D4) were arranged perpendicularly to four word line patterns (W1, W2, W3 and W4). Moreover, the following were arranged: a pattern 21 for specifying a region to form a writing transistor, a pattern 22 for specifying a region where a reading transistor was to be formed, a pattern 23 for forming a channel domain of the reading transistor, and four 2-bit cells (shown by a broken line in FIG. 14) whose main portion was constituted with the bit-line connection hole 30. Other layout patterns for forming cells used the same patterns as those shown in FIGS. 2 and 3.

A potential difference of 0.5 V was detected between the bit lines of the data "1" and dummy-cell data "0" by operating the memory cell array of this embodiment under the operational conditions that the supply voltage was 1.5 V, the word line potential for data write was 0 V, the word line potential for data read is 1.5 V, and the word line potential under standby state was 1.0 V, similarly to Embodiment 1. This value was a detection potential difference enough for performing normal memory operation in a larger memory array. The cell area of 0.6 $\mu m^2$ was also realized similarly to Embodiment 1.

Embodiment 3

Figure 15:
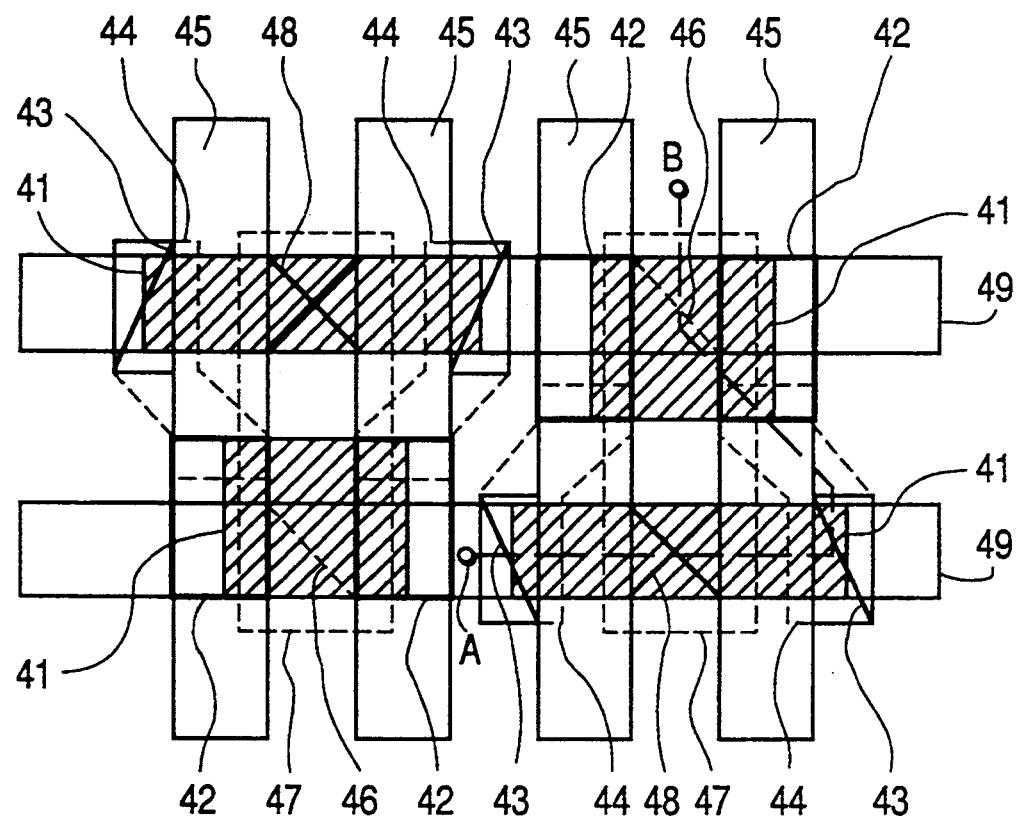
FIG. 15 is a plane layout drawing of the memory cell of a third embodiment of the present invention.

A third embodiment of the present invention will be described below by referring to FIG. 15, showing a plane layout, and FIGS. 16 to 19, showing a memory-cell sectional view, at the position A-B in FIG. 15, for the structure at various fabrication processing steps.

The memory cell of this embodiment has the same structure as the memory cell described in Embodiment 1, except that the reading transistor of this embodiment uses the inner wall of the trench formed in the semiconductor substrate as a channel.

In the plane layout of the memory cell of this embodiment shown in FIG. 15, the following are arranged: a pattern 41 for specifying a region for forming a writing transistor and the drain region of a reading transistor, a word line pattern 45 arranged by being covered with a pattern 42 for specifying the channel region of the reading transistor, a pattern 44 for forming a charge storage node connected to the source region of the writing transistor through a connection hole 43, a pattern 47 for forming an interconnection pad connected to the drain region of the writing transistor and that of the reading transistor through connection holes 46 and 48, and a pattern 49 for forming a bit line to be connected to the interconnection pad. In the following description of a memory cell fabrication process of this embodiment, the cell cross section at the position A-B, shown by a broken line in FIG. 15, will be described for various fabrication processing steps.

Figure 16:
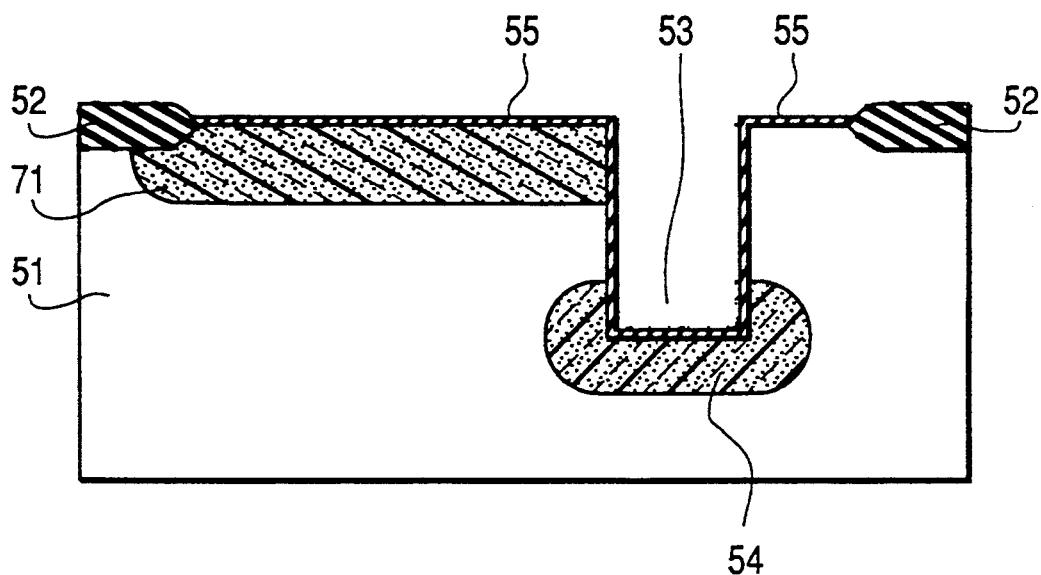
FIG. 16 is a sectional view for illustrating a method for fabricating the memory cell of the third embodiment of the present invention.

First, as shown in FIG. 16, an n-type well region 71 with a junction depth of 0.7 $\mu m$ and surface phosphorus (P) concentration of $5 \times 10^{17}/cm^3$ is formed only in the region where a writing transistor is to be formed, on a p-type silicon substrate 51 having a resistivity of 10 cm. An element isolation region 52 comprising a 350 nm-thick silicon oxide film is formed on the n-type well region 71, by using the pattern 41 for specifying the forming region of the writing transistor and the drain region of the reading transistor shown in FIG. 15. A 2 $\mu m$-deep trench 53 is formed in the region where the reading transistor is to be formed; a reading transistor source region 54, with an average phosphorus (P) concentration of $1 \times 10^{20}/cm^3$, is formed at the bottom of the trench 53; and, moreover, a gate insulating film 55 for a reading transistor, comprising a 5 nm-thick silicon oxide film, is formed on the p-type silicon substrate 51, including within the trench.

Figure 17:
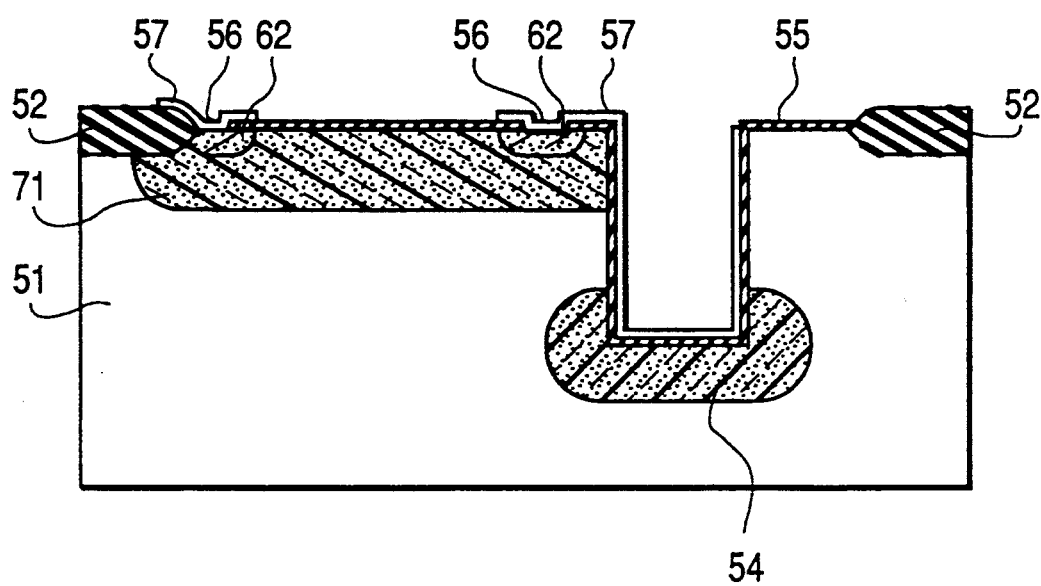
FIG. 17 is a sectional view for further illustrating this method for fabricating the memory cell of the third embodiment of the present invention.

Then, as shown in FIG. 17, an opening 56 is formed in the gate insulating film 55 by using the connection hole pattern 43, before forming a charge storage node 57 comprising a 50 nm-thick polycrystalline silicon film containing boron (B), through the CVD method. While this CVD is performed, a source-drain region 62 of the writing transistor is formed through thermal diffusion from the charge storage node 57.

Figure 18:
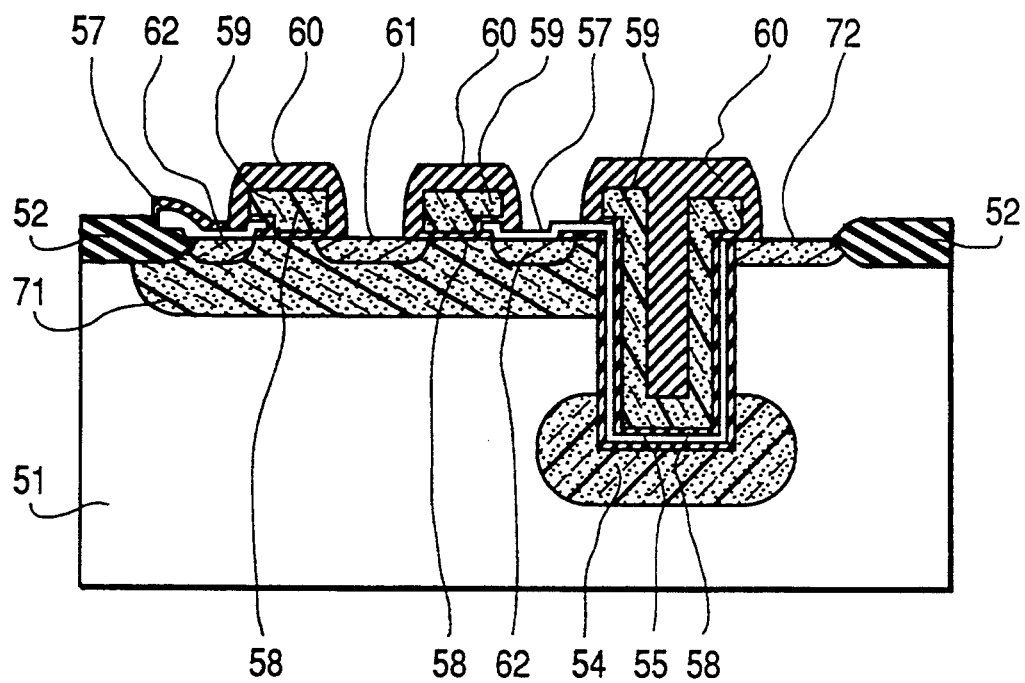
FIG. 18 is a sectional view for further illustrating this method for fabricating the memory cell of the third embodiment of the present invention.

Moreover, as shown in FIG. 18, a gate insulating film 58 of the writing and reading transistors, comprising a 5 nm-thick silicon oxide film, is formed through the CVD method, and a word line 59 comprising a polycrystalline silicon film with a resistivity of 50 cm is formed through the CVD method.

Then, an insulating film 60 comprising a 100 nm-thick silicon oxide film is formed around the word line 59; and, moreover, a drain region 61 of the writing transistor is formed by implanting boron (B) ions at an acceleration energy of 10 keV and at a dose of $1 \times 10^{15}/cm^3$ before forming a drain region 72 of the reading transistor by implanting arsenic (As) ions at an acceleration energy of 30 keV and at a dose of $2 \times 10^{15}/cm^3$.

Figure 19:
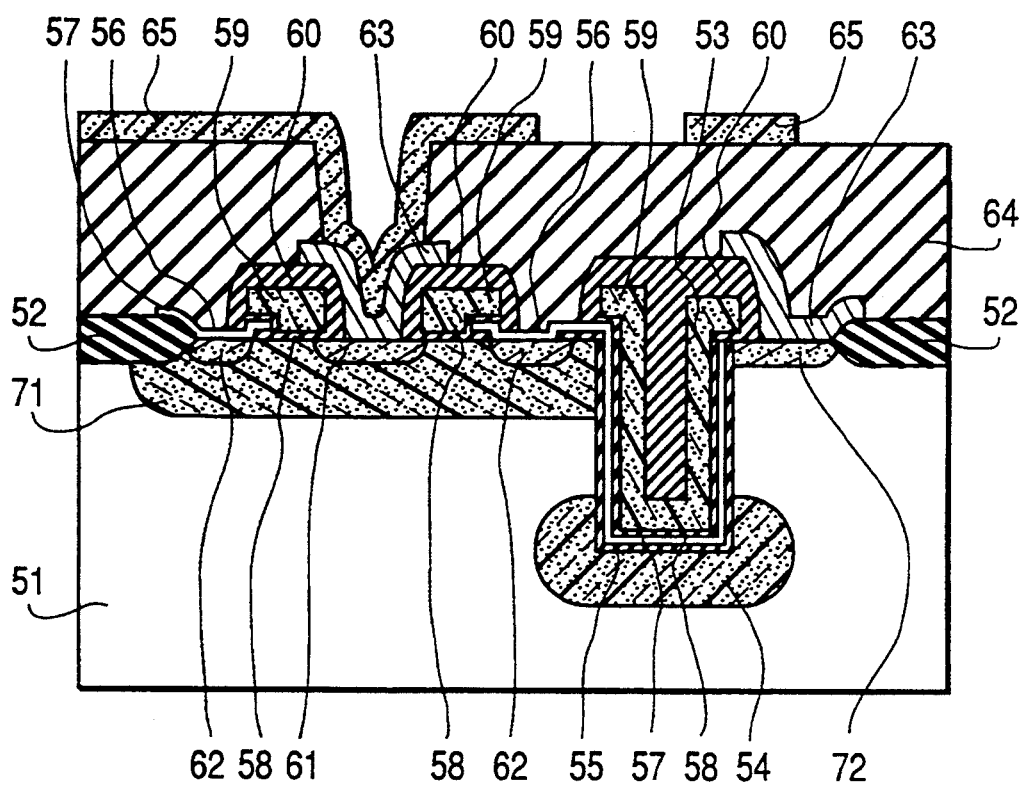
FIG. 19 is a sectional view for further illustrating this method for fabricating the memory cell of the third embodiment of the present invention.

Finally, as shown in FIG. 19, a first interconnection pad 63 comprising a 100 nm-thick titanium nitride (TIN) film, deposited through the CVD method, is formed on one of the source-drain regions of the writing transistor, and an insulating film 64 serving as an element protective film is deposited on top of the first interconnection pad 63 through the CVD method. Thereafter, a bit line connection hole is formed through the insulating film 64, overlying the first interconnection pad 63, and a bit line 65 is formed to complete the memory cell of this embodiment. The first interconnection pad 63 is connected to the source-drain region 61 of the writing transistor, and simultaneously connected to the drain region 72 of the reading transistor.

It was confirmed that the memory cell of this embodiment normally operated under the operational conditions that the supply voltage was 1.5 V, the word line potential for data write was 0 V, the word line potential for data read was 1.5 V, and the word line potential under the standby state was 1.0 V. Moreover, a word line pitch of 0.6 $\mu m$, a bit line pitch of 0.5 $\mu m$, and a cell area of 0.72 $\mu m^2$ were realized. This makes it possible to fabricate a DRAM with a capacity of 100 megabits or more through the 0.3-$\mu m$ fabrication technique.

Embodiment 4

In this embodiment, an example is described below in which the memory cell in Embodiment 1 is formed on an SOI (silicon on insulator) substrate, insulated and isolated from a semiconductor substrate by an insulating film.

Figure 20:
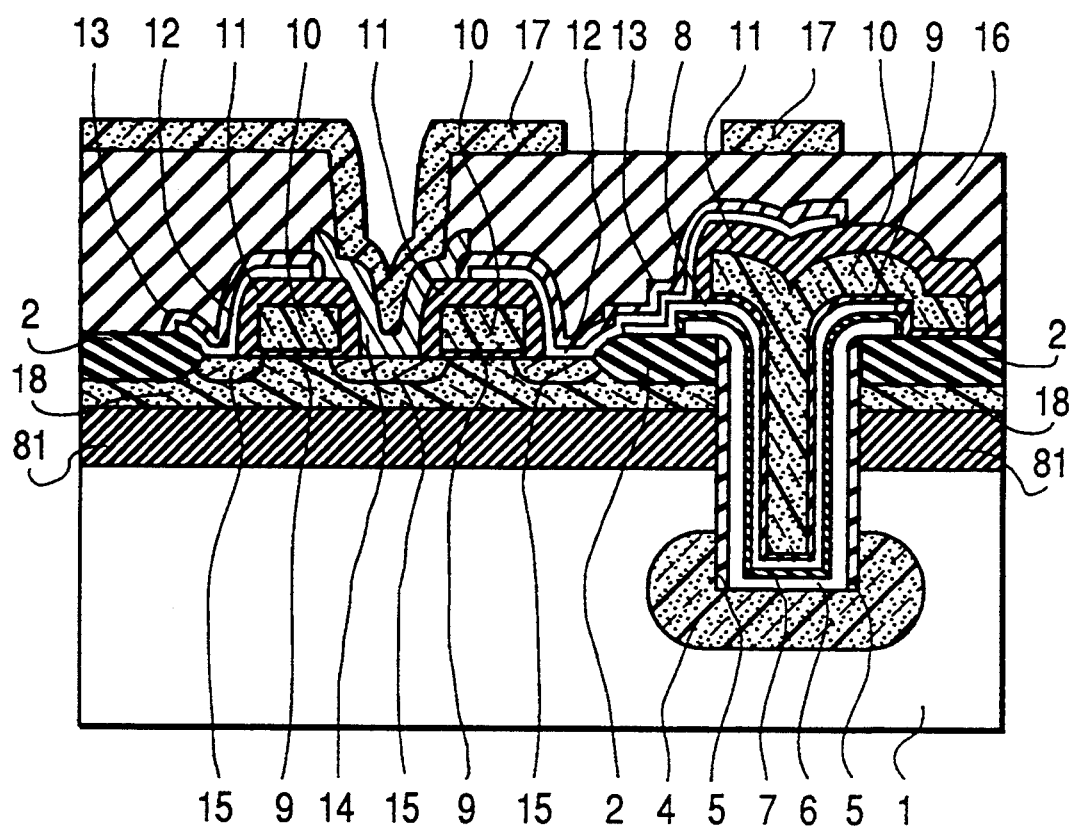
FIG. 20 is a sectional view of the memory cell of a fourth embodiment of the present invention.

FIG. 20 shows a sectional view of the memory cell of this embodiment, which uses the same memory cell structure and fabrication process as Embodiment 1, except that a 300 nm-thick silicon oxide film 81 is formed between a p-type silicon substrate 1 and n-type well region 18.

The SOI substrate of this embodiment is made by implanting oxygen ($O_2$) ions into a normal silicon substrate at an acceleration energy of 200 keV and at a dose of $8 \times 10^{16}/cm^3$, so as to embed the 300 nm-thick silicon oxide film 81, formed through thermal treatment at 1150° C. in a nitrogen atmosphere.

The cell of Embodiment 1, shown in FIG. 12, has a parasitic pnp bipolar structure in which the source-drain region 15 and n-type well region 18 of the writing transistor, and the p-type silicon substrate 1, are close to each other in the vertical direction. Therefore, it is necessary to increase the thickness of the n-type well region 18 to 1 μm or more in order to avoid parasitic bipolar action during memory operation. For the memory cell of this Embodiment 4, however, it is possible to avoid the above parasitic bipolar structure by forming a silicon oxide film 81 between n-type well region 18 and the p-type silicon substrate 1. Thus, it is possible to decrease the thickness of the n-type well region 18 to 0.5 μm or less, and resultingly decrease the depth of the trench forming the reading transistor up to approximately 1.5 μm. Therefore, the memory cell of the present invention can more easily be fabricated.

Embodiment 5

For this embodiment, an example will be described in which a test circuit is operated to confirm the memory operation of the memory cell described in Embodiment 1.

Figure 21:
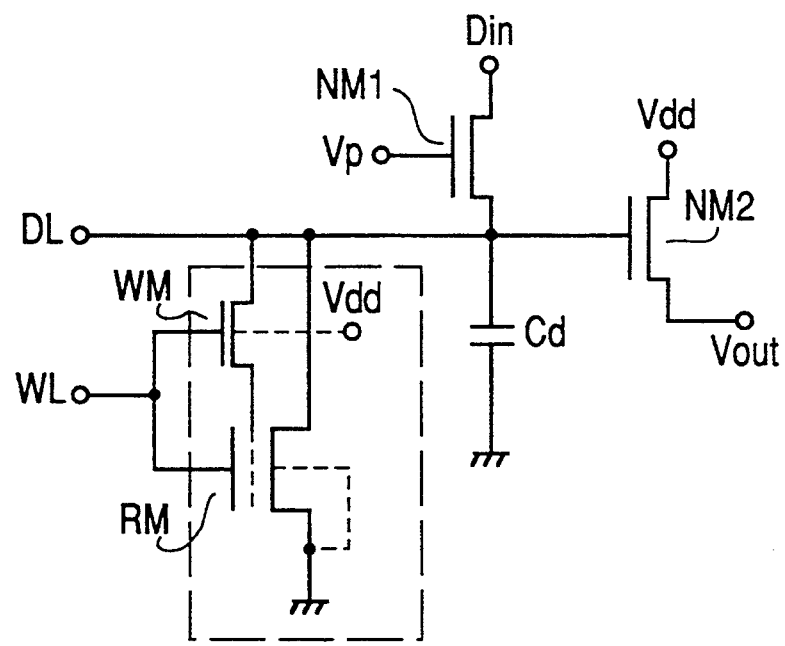
FIG. 21 is a circuit diagram of a memory of a fifth embodiment of the present invention.

FIG. 21 shows an equivalent circuit of the memory cell of this embodiment which is formed with a memory cell comprising a p-channel writing transistor WM and an n-channel reading transistor RM. The broken line, surrounding the writing and reading transistors, shows a memory cell region of the circuit. The p-channel writing transistor has an effective channel length of 0.25 μm and a threshold voltage of −0.3 V; and the n-channel reading transistor is a polycrystalline silicon thin-film reading transistor with an effective channel length of 1.2 μm and a threshold voltage of 1.6 V. Vdd is the supply voltage for the circuit, and the channel of the writing transistor is electrically connected to the supply voltage. For common CMOS circuit operation, the substrate of p-channel and n-channel transistors should be set to the highest and lowest potential, respectively. The equivalent circuit also includes an n-channel pre-charging transistor NM1 for charging a bit line DL, and an n-channel output transistor NM2 for sensing the potential change of the bit line DL. rout is the output voltage of transistor NM2, and is proportional to the bit line potential. Through use of the output transistor NM2, sensing the potential change of the bit line, sensing can be performed without disturbing the memory operation during measurement, because the device for measuring dynamic voltage change has a large input capacitance. In the equivalent circuit in FIG. 21, a 100-fF capacitor Cd connected between the bit line DL and earth is a bit-line capacitor added by assuming a 256-megabit-class memory cell array.

FIG. 22 shows the operating potential waveform of each portion shown in FIG. 21. The following is the description of memory operation in time series.

The memory operation of this embodiment is classified into 8 phases, as shown by A, B, C, D, G and H in FIG. 22. The phase A is a test zone, B is a data-"1" write zone, C is a bit-line pre-charging zone, D is a data-"1" read zone, E is a data-"0" write zone, F is a test zone to confirm if data is not turned over, G is a bit-line pre-charging zone, and H is a data-"0" read zone.

First, it is confirmed that the potential (Vw1) of the word line WL of the memory cell, in a standby state, is set to 0.9 V, and the data "1" is not written in the charge storage node of the memory cell, only by applying the supply voltage of 1.5 V to the drain Din of the pre-charging transistor NM1 in the zone A where the writing transistor WM is off, before applying the supply voltage of 1.5 V also to the gate electrode Vp of the pre-charging transistor NM1 and raising the potential of the bit line DL up to the supply voltage of 1.5 V.

Then, in the zone B, a voltage of 1.5 V is applied to the drain Din and gate electrode Vp of the pre-charging transistor NM1; before reading the data "1" the bit line DL potential is raised up to the supply voltage of 1.5 V before lowering the potential Vw1 of the word line to 0 V, turning on the writing transistor WM, and storing positive charges in the charge storage node of the reading transistor RM to lower the threshold voltage of the reading transistor RM. In this embodiment, a threshold voltage drop of approximately 0.4 V was obtained.

Then, in the zone C, a voltage of 1.5 V is applied to the drain Din and gate electrode Vp of the pre-charging transistor NM1, before reading the data "1" to pre-charge the potential of the bit line DL up to the supply voltage of 1.5 V. Then, the potential of the word line is raised to 1.5 V in the zone D. In this case, the threshold voltage of the reading transistor RM is lowered from 1.6 V to approximately 1.2 V due to positive charges in the charge storage node. Therefore, the reading transistor RM is turned on and the potential of the bit line DL is lowered because the pre-charged charges of the line are drawn to the earth, and the source potential V out of the output transistor NM2 is reversed to the earth potential. Thereby, data-"1" read is completed.

Moreover, in the zone E, the potential of the drain Din of the pre-charging transistor NM1 is fixed at the earth potential to raise the gate electrode Vp and lower the potential of the bit line DL to the earth potential, before lowering the potential of the word line to the earth potential to purge the charges out of the charge storage node and write the data "0".

Then, in the zone F, it is confirmed that the data "0" is not changed to the data "1" only by applying the supply voltage of 1.5 V to the drain Din of the pre-charging transistor NM1 before applying the voltage of 1.5 V to the gate electrode Vp of the pre-charging transistor NM1 to raise the potential of the bit line DL up to the supply voltage of 1.5 V.

Then, in the zone G, the voltage of 1.5 V is applied to the drain Din and gate electrode Vp of the pre-charging transistor NM1, before reading the data "0" to pre-charge the potential of the bit line DL up to the supply voltage of 1.5 V. In the zone H, the potential of the word line is raised to 1.5 V. In this case, the threshold voltage of the reading transistor RM is kept at 1.6 V because no charge is stored in the charge storage node. Therefore, because the reading transistor RM is off, the potential of the bit line DL is kept at the pre-charged potential. Thus, data-"0" read is completed.

For this embodiment, a memory cell is described which comprises a p-channel writing transistor and an n-channel reading transistor. However, the same memory operation can be obtained by changing the potential relation for a memory cell comprising an n-channel writing transistor and a p-channel reading transistor.

Embodiment 6

In this embodiment, an example will be described in which the memory cell of the present invention comprises a vertical thin-film transistor provided on the inner wall of a trench formed in an insulating film.

Figure 23:
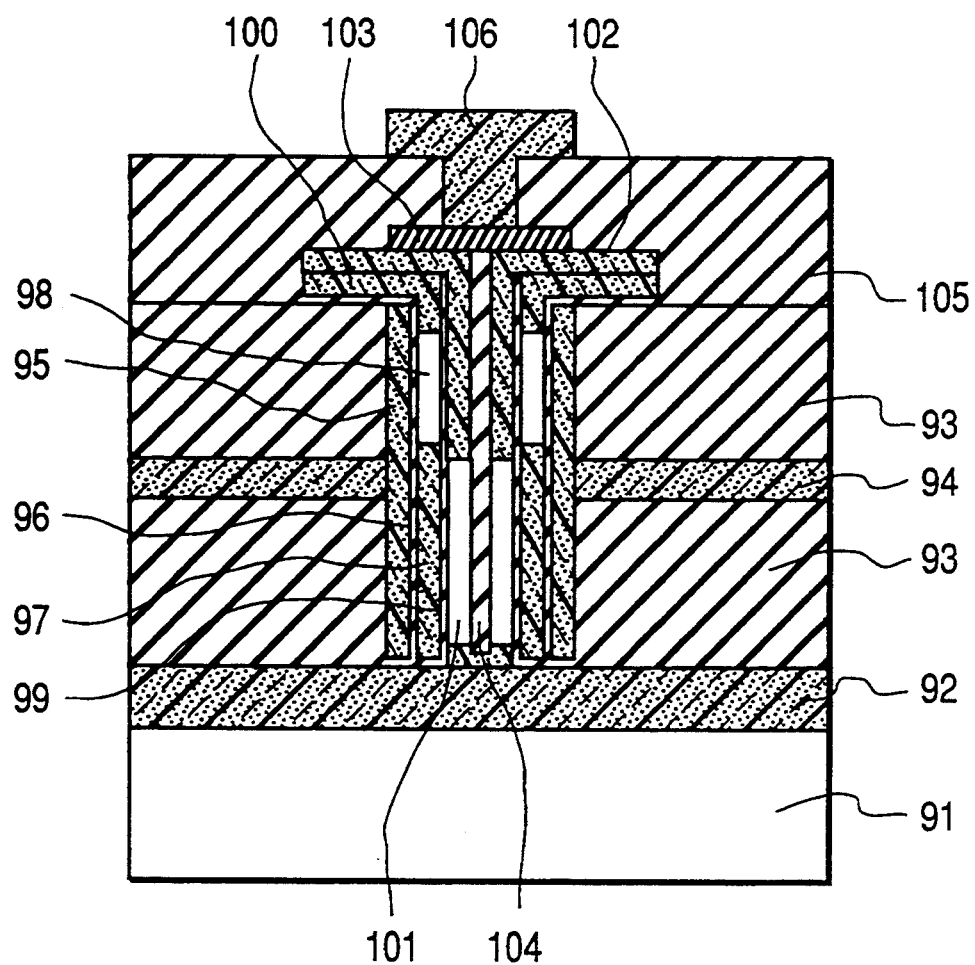
FIG. 23 is a sectional view of a memory cell of a sixth embodiment of the present invention.

FIG. 23 shows a sectional view of the memory cell of this embodiment. In FIG. 23, a source region 92 of a reading transistor RM comprising a 200 nm-thick polycrystalline silicon film doped into n-type is formed on a p-type (monocrystalline) silicon substrate 91.

Moreover, a word line 94 comprising a 150 nm-thick polycrystalline silicon film doped into p-type is formed on a 0.5 μm-thick silicon oxide film 93, and a trench is so formed that it crosses the silicon oxide film 93 and word line 94.

Furthermore, a p-channel writing transistor WM is formed on the inner wall of the trench, which comprises a gate electrode 95 comprising a polycrystalline silicon film connected to the word line 94, a gate insulating film 96, charge storage node 97, channel region 98, and drain region 100. Furthermore, an n-channel reading transistor RM is formed inside the writing transistor, which comprises a gate insulating film 99, channel region 101, drain region 102, and source region 92 by using the gate electrode 95 of the writing transistor as a gate electrode through the charge storage node 97 of the writing transistor, and the drain region 100 of the writing transistor WM and the drain region 102 of the reading transistor RM are connected to a bit line 106 through an interconnection pad 103. The central portion of the trench is filled in with an insulating film 104 and the top of the trench is also protected by an insulating film 105. As can be seen in FIG. 23, channel region 98 of the writing transistor and channel region 101 of the reading transistor do not overlap.

Figure 24:
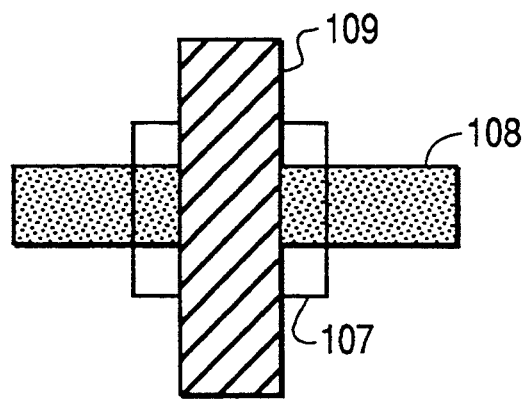
FIG. 24 is a plane layout drawing of the memory cell of the sixth embodiment of the present invention.

FIG. 24 shows a plane layout of the memory cell of this embodiment having the cross sectional structure in FIG. 23, in which a main layout pattern is constituted by a pattern 108 for forming a word line, pattern 109 for forming a bit line, and a pattern 107 for forming a trench.

It was confirmed that the memory cell of this embodiment normally operated under operating conditions such that the supply voltage was 1.5 V, the word line potential for data write was 0 V, the word line potential for data read was 1.5 V, and the word line potential in a standby state was 1.0 V. Moreover, a word line pitch of 0.6 μm, trench opening diameter of 0.4 μm, and cell area of 0.36 μm² were realized. This makes it possible to fabricate a 256-megabit DRAM through the 0.25-μm fabrication technique.

Accordingly, the present invention makes it possible to greatly decrease an area of the memory cell, and to fabricate a large-capacity DRAM having a self-amplifying memory cell capable of achieving stable memory operation with a relatively small stored charge capacity.

While we have shown and described several embodiments in accordance with the present invention, it is understood that the same is not limited thereto, but is susceptible to numerous changes and modifications as known to one having ordinary skill in the art, and we therefore do not wish to be limited to the details shown and described herein, but intend to cover all such modifications as are encompassed by the scope of the appended claims.

We claim:

1. A method of operating a semiconductor memory having memory cells with (a) a writing transistor and (b) a reading transistor with a floating gate, with a single bit line electrically connected to source-drain regions of the writing and reading transistors, and with a single word line electrically connected to gate electrodes of the writing and reading transistors, the floating gate being electrically connected to a source-drain. path of the writing transistor, comprising the steps of:
    setting a potential of the word lines, in a standby state, to a value between a potential for writing data into the memory and a potential for reading data from the memory; and
    performing both (a) decreasing the potential of the word line in order to perform one of reading data in the memory or writing data into the memory; and (b) increasing the potential of the word line in order to perform the other of reading data in the memory or writing data into the memory.

2. The method of operating a semiconductor memory according to claim 1, wherein each memory cell has a single word line.

3. The method of operating a semiconductor memory according to claim 2, wherein each memory cell has a single bit line.

4. The method of operating a semiconductor memory according to claim 1, wherein the potential of each word line is decreased to ground potential in order to write data into the memory, and the potential of each word line is increased to a supply voltage in order to read data in the memory.

5. The method of operating a semiconductor memory according to claim 4, wherein the potential of the word line in the standby state is approximately ½ the supply voltage.

6. The method of operating a semiconductor memory according to claim 1, wherein the decreased potential to perform one of reading data in the memory or writing data into the memory is minus supply voltage (−Vcc), and the increased potential to perform the other of reading data in the memory or writing data into the memory is the supply voltage (+Vcc).

7. The method of operating a semiconductor memory according to claim 6, wherein the potential of the word lines in the standby state is ground potential.

8. The method of operating a semiconductor memory according to claim 1, wherein a channel region of the writing transistor is of opposite conductivity type to that of a channel region of the reading transistor, whereby the writing transistor and reading transistor are complementary transistors.

* * * * *